(12) United States Patent
Babu et al.

(10) Patent No.: US 12,382,774 B2
(45) Date of Patent: *Aug. 5, 2025

(54) TRANSLUCENT PHOTOVOLTAIC DEVICE AND A METHOD FOR MANUFACTURING THEREOF

(71) Applicant: SAULE SPOLKA AKCYJNA, Wroclaw (PL)

(72) Inventors: Vivek Babu, Wroclaw (PL); David Forgacs, Wroclaw (PL)

(73) Assignee: SAULE SPOLKA AKCYJNA, Wroclaw (PL)

( * ) Notice: Subject to any disclaimer, the term of this patent is extended or adjusted under 35 U.S.C. 154(b) by 0 days.

This patent is subject to a terminal disclaimer.

(21) Appl. No.: 17/637,701

(22) PCT Filed: Aug. 23, 2020

(86) PCT No.: PCT/EP2020/073584
§ 371 (c)(1),
(2) Date: Feb. 23, 2022

(87) PCT Pub. No.: WO2021/037773
PCT Pub. Date: Mar. 4, 2021

(65) Prior Publication Data
US 2022/0293875 A1    Sep. 15, 2022

(30) Foreign Application Priority Data
Aug. 23, 2019 (EP) .................................... 19461571

(51) Int. Cl.
*H10K 30/57* (2023.01)
*H10K 30/15* (2023.01)
(Continued)

(52) U.S. Cl.
CPC ............ *H10K 30/57* (2023.02); *H10K 30/151* (2023.02); *H10K 30/30* (2023.02); *H10K 39/12* (2023.02);
(Continued)

(58) Field of Classification Search
CPC ...... H10K 71/162; H10K 30/50; H10K 39/12; H10K 85/50; H01L 31/0468; Y02E 10/549
See application file for complete search history.

(56) References Cited

U.S. PATENT DOCUMENTS

| 4,795,500 A | 1/1989 | Kishi et al. |
| 9,257,592 B2 | 2/2016 | Lu et al. |

(Continued)

FOREIGN PATENT DOCUMENTS

| CN | 101232058 A | 7/2008 |
| CN | 104966548 B | 6/2017 |

(Continued)

OTHER PUBLICATIONS

Xu, Hole Selective NiO Contact for Efficient Perovskite Solar Cells with Carbon Electrode, Nano Lett. 2015, 15, 2402-2408, Supplementary Materials, pp. 1-11 (Year: 2015).*

(Continued)

*Primary Examiner* — Devina Pillay
(74) *Attorney, Agent, or Firm* — Rivka Friedman (57) ABSTRACT

A translucent photovoltaic (PV) device comprising a semi-transparent substrate 120 and at least one translucent photovoltaic (PV) cell 100, the PV cell 100 comprising a stack 110 of layers disposed on the substrate 120, the stack 110 comprising: a front electrode layer 112, a back electrode layer 113, and a perovskite photoactive layer 111 between the anode layer and the cathode layer. The back electrode layer 113 comprises carbon, wherein the stack 110 of layers (Continued)

comprises laser-made light-transmissive apertures 130 extending through at least the back electrode layer 113 and the perovskite photoactive layer 111 wherein the light-transmissive apertures 130 are fully surrounded by the layer stack 110 layers that contribute to the power conversion.

19 Claims, 7 Drawing Sheets

(51) Int. Cl.
    *H10K 30/30* (2023.01)
    *H10K 30/50* (2023.01)
    *H10K 39/12* (2023.01)
    *H10K 71/16* (2023.01)
    *H10K 85/50* (2023.01)

(52) U.S. Cl.
    CPC ........... *H10K 71/162* (2023.02); *H10K 85/50* (2023.02); *H10K 30/50* (2023.02)

(56) References Cited

U.S. PATENT DOCUMENTS

| | | | | |
|---|---|---|---|---|
| 2006/0112987 | A1* | 6/2006 | Nakata | H01L 31/03921 438/57 |
| 2007/0251566 | A1 | 11/2007 | Ouchida et al. | |
| 2009/0151783 | A1* | 6/2009 | Lu | H01L 31/0468 136/256 |
| 2010/0068849 | A1* | 3/2010 | Lu | H01L 31/022466 257/E21.238 |
| 2016/0380125 | A1* | 12/2016 | Snaith | H10K 85/00 136/256 |
| 2018/0122584 | A1* | 5/2018 | Kim | H10K 30/82 |
| 2019/0198256 | A1 | 6/2019 | Hayakawa et al. | |
| 2020/0279962 | A1* | 9/2020 | Heiss | H01L 31/0463 |
| 2020/0294728 | A1* | 9/2020 | Zhu | H10K 30/30 |
| 2020/0381183 | A1* | 12/2020 | Christensen | H10K 71/15 |

FOREIGN PATENT DOCUMENTS

| | | |
|---|---|---|
| CN | 108574048 A | 9/2018 |
| CN | 109273608 A | 1/2019 |
| CN | 106356456 B | 3/2019 |
| WO | 2019070977 A1 | 4/2019 |

OTHER PUBLICATIONS

Liang, All that glitters is not gold: Recent progress of alternative counter electrodes for perovskite solar cells, Nano Energy 52 (2018) 211-238 (Year: 2018).*

Schoonderbeek, Laser Processing of Thin Films for Photovoltaic Applications, JLMN-Journal of Laser Micro/Nanoengineering vol. 5, No. 3, 2010 (Year: 2010).*

International Preliminary Report on Patentability; Chapter II; PCT Patent Application No. PCT/EP2020/073584; dated Dec. 14, 2021; 7 pages.

International Search Report and Written Opinion; PCT Patent Application No. PCT/EP2020/073584 dated Nov. 30, 2020; 12 pages.

Rakocevic et al., "Translucent, Color-Neutral and Efficient Perovskite Thin Film Solar Modules", J. Mater. Chem. C, vol. 6, 2018, pp. 3034-3041.

\* cited by examiner

TRANSLUCENT PHOTOVOLTAIC DEVICE AND A METHOD FOR MANUFACTURING THEREOF

RELATED APPLICATIONS

This application is a U.S. National Phase of PCT Patent Application No. PCT/EP2020/073584 having International filing date of Aug. 23, 2020, which claims the benefit of priority of European Patent Application No. 19461571.2 filed on Aug. 23, 2019. The entire contents of the above-referenced applications and of all priority documents referenced in the Application Data Sheet filed herewith are hereby incorporated by reference for all purposes.

TECHNICAL FIELD

The present disclosure relates to a translucent photovoltaic device and a method for manufacturing thereof.

BACKGROUND

Thin film perovskite photovoltaic (PV) devices are attractive due to their high absorption coefficient, high power conversion efficiencies, low weight and high-speed production capabilities.

Desirable features of these devices are semi-transparency or translucency, which are related to the constant increase in energy consumption. Semi-transparent and translucent PV devices, especially those of low weight and preferably flexible, are suitable to be applied on the windows and other see-through surfaces. Hence, these kinds of PV devices may cover not only the opaque surfaces (as roofs or walls), but they can take a form of glass walls of buildings, stickers for the cars windows and car bodies, as well as forms of casings for cell-phones, tablets, laptops, as well as other electronic devices.

The semi-transparency/translucency of the perovskite PV devices is known to be obtained by three different methods. The first method involves the use of semi-transparent materials, thereby providing semi-transparency of the device. The second method consists in the use of opaque (non-transparent) materials, such as metals, for the respective layers of the PV device following by partial removal of the opaque material. thereby forming see-through holes that enable light to pass through the device. The removal is usually accomplished by mechanical scrubbing or laser ablation. The third method is by depositing metallic grids on conductive polymer layer providing translucency. The deposition is by different printing techniques such as inkjet, screen etc.

The PV devices obtained by the first method are typically called semi-transparent, whereas the one obtained by the second and third method are called translucent.

Although the laser ablation provides the required translucency of the PV devices, it removes a part of the working material of the PV cell thereby providing decreased efficiency of the whole PV device. Nonetheless, this drawback becomes negligible when it comes to substantially high-efficient PV devices, such as those having perovskite photoactive layers. Moreover, the efficiency of the obtained translucent devices can be controlled by increasing or decreasing a size of the ablated area, whereas a proper balance between the desired translucency and a volume of the ablated material gives the required characteristic of the PV device, depending on needs of individual applications.

Nevertheless, the drawback which does remain important in the field of translucent PV devices is associated with the method of the ablation itself, and hence the characteristic of formed see-though apertures providing translucency. Also, depending on the material used, some of the translucent PV devices show red-color high transparency, which limits their range of applications.

Unlike the latter, the translucent perovskite PV devices feature a neutral color-light transmission. Further, the perovskite PV devices show high power conversion efficiencies, which makes them usable in the fields of translucent PV devices, with formed light-transmissive see-through apertures.

A scientific publication "*Translucent, Color-neutral and Efficient Perovskite Thin Film Solar Modules*", L Rakocevic, et al, J. Mater. Chem. C, 2018, DOI: 10.1039/C7TC05863B describes a translucent perovskite PV device, in which the light transmitting apertures are obtained by both laser ablation and mechanical scrubbing. The device constitutes a perovskite solar PV cells module of planar n-i-p architecture. The module consists of monolithically interconnected PV cells. The method for manufacturing of the PV device consists in forming an opaque device and subsequently applying additional patterning (called P4) in a strip design. P4 patterning method involves removal of four layers: bottom (back) contact layer, hole transporting layer, the perovskite photoactive layer, and an electron transporting layer. Nonetheless, the patterning P4 does not remove the front contact layer, i.e. the electrode disposed directly on the semi-transparent substrate. The patterning P4 is performed by using the picosecond laser ablation—in one embodiment, and mechanical scrubbing method—in the second embodiment. The obtained strips are parallel to each other together forming an alternate opaque and transparent strips design, where each which opaque strip acts as a single module. Therefore, the formed translucent apertures, to some extent, divide one PV cell into plurality electrically connected smaller strip-like architectures disposed on the semi-transparent front electrode layer. Therefore, the light-transmissive apertures of that device are not fully surrounded by the layer stack layers that contribute to the power conversion (in particular, in view of delamination of the top metal electrode during the laser ablation, the P4 surrounding is non-active). This publication further describes the drawbacks of both methods, providing that laser patterning causes damages, i.e. delamination of functional layers of the PV device.

Furthermore, a patent publication U.S. Pat. No. 9,257,592 describes the photovoltaic device comprising a plurality of light-transmissive apertures. The device comprises a substrate, a first electrode layer, a photoconductive layer and an outermost second electrode layer (made of metal). The first light-transmissive apertures are formed on the second electrode layer, whereas the apertures are further extended in a depth direction to the photoconductive layer to form a plurality of second light-transmissive apertures corresponding to the first light-transmissive apertures. A projected area of each of the second light-transmissive apertures is smaller than that of a corresponding first light-transmissive aperture. The difference in the size of areas of the first and second light-transmissive apertures provides elimination of short-circuits. Nonetheless, the presented method involves a complex multi-step laser method for forming separately first and second light-transmissive apertures. This multi-step is necessary, because if the laser cutting was to be performed via all layers in a single step, then due to a thermal effect, the second electrode metal layer could melt, thus causing bridging of the conductive layers and hence a short-circuit therebetween. Therefore, the second electrode metal layer is removed in a first step (forming a larger area hole) and the further layer are removed in a second step (forming a smaller area hole). Furthermore, the light-transmissive apertures of that device are not fully surrounded by the layer stack layers that contribute to the power conversion (in particular, in view of lack of top electrode in the surrounding of the aperture, its surrounding is non-active).

WO 2019/070977 A1 describes a large-scale method for manufacturing PV modules with perovskite light-active material, however does not explicitly mention the transparency of the module. According to this disclosure, the cells may be performed on the substrate (which is preferably glass) by the use of laser or mechanical scribing (patterning P1-P3) of the respective layer to obtain separation of the respective cells. The back electrode may be made of carbon but it does not assign any special advantages of using this material as carbon is one item from a longer list of possible materials to be used.

CN 109 273 608 A describes a transparent PV cell, which comprises laser-made apertures in the form of tangent lines, extending through at least the back electrode layer, which is made of metal instead of carbon. These apertures are made in P3 patterning step and they are not fully surrounded by the layers of a single PV cell.

CN 108 574 048 A describes a PV module comprising a perovskite light-active layer and the back electrode made from a carbon paste. This document mentions some advantages of using carbon electrode, such as low cost, good stability and simple process. It also discloses how to avoid short circuits by using insulating layer to separate positive and negative electrodes of the unit itself. However, PV module according to this disclosure does not comprise, within a single cell, the apertures provided for light transparency of the cell. It only shows the apertures between the adjacent cells which are not fully surrounded by the layer stack of the layers of each cell.

U.S. Pat. No. 4,795,500 discloses a PV module which comprises light-transmissive apertures formed in plurality in the stack of each PV cell, the apertures being fully surrounded by the stack layers, the back electrode made of metal, and the apertures formed using a laser. However, the PV module according to U.S. Pat. No. 4,795,500 has drawbacks, namely problems of short circuit and leakage current due to the high temperature laser cutting process.

CN 101 232 058 A describes a method for preparing a translucent PV module. It also provides a solution for the above mentioned drawbacks of U.S. Pat. No. 4,795,500 by providing two kinds of apertures, one extending in Y direction and the other extending in X direction:

US 2007/251566 A1 describes light-emitting device comprising translucent light-emitting layer which is arranged on a light incident surface of the photovoltaic cell. The device comprises a light-transmitting photovoltaic cell and a light source provided on the back surface side of the photovoltaic cell. The device is arranged so that the light emitted from the light source is transmitted through the photovoltaic cell and outputted to the front surface side of the photovoltaic cell. The device is provided with photoelectric conversion layers made of silicon instead of perovskite light-active layer. Furthermore it has openings provided for transmitting the light from the interior of the module to the outside (as the light (LED) is generated by the module), and does not mention using carbon for the back electrode layer.

US 2006/112987 A1 describes the solar module comprising laser-made light-transmissive apertures that are fully surrounded by the stack of layers and are made at least in the back electrode layer. The module does not have the perovskite light active layer as well as the carbon back electrode layer.

US 2019/198256 A1 describes solar cell comprising a perovskite light-active layer and, between the photoelectric conversion layer and the anode, a diffusion prevention layer comprising at least one selected from the group consisting of metal oxides, metal nitrides, and metal oxynitrides each containing a group 6 to 15 metal in the periodic table; and carbon. The cathode is light transparent and anode can be made of metal. US 2019/198256 A1 does not mention a carbon electrode, nor light-transmissive apertures formed in plurality in the stack of each solar cell of the module.

CN 106 356 456 B describes a solar cell based on a perovskite heterojunction. The solar cell comprises a substrate, a transparent electrode, an electron transporting layer, a metal skeleton layer, a perovskite absorbing layer, a hole transport layer, and the counter (back) electrode. CN 106 356 456 B neither describes nor suggests the light-transmissive apertures formed in plurality in the stack of each solar cell of the module to obtain light-transparency of a single solar cell.

As follows from the aforementioned publications, it would be desirable to further develop the method for manufacturing translucent photovoltaic (PV) devices with laser-made light-transmissive apertures, providing both the simplification of the manufacturing process and elimination of short-circuits and delamination effects of working layers the translucent PV device, so as to obtain the translucent PV device of improved working characteristic. Furthermore, it would be desirable to provide the PV device of low weight exhibiting flexibility so as to widen the scope of possible applications thereof.

SUMMARY OF THE DISCLOSURE

The invention is directed to a translucent photovoltaic device according to claim 1 and a method for manufacturing the translucent photovoltaic device according to claim 9. Preferred embodiments are defined in the dependent claims.

BRIEF DESCRIPTION OF DRAWINGS

The object of the present disclosure is shown by means of example embodiments in a drawing, wherein.

DETAILED DESCRIPTION

The developed method for manufacturing a translucent photovoltaic (PV) device allows one to obtain the PV devices comprising light-transmissive apertures of improved quality. Especially, the obtained apertures do not comprise metallic impurities and feature a regular shape, without significant delamination effect. Due to the above features, the short-circuits are not observed for the obtained PV devices. Moreover, the developed method is simplified and it may be accomplished with the use of less expensive nanosecond lasers for forming the light-transmissive apertures, instead of expensive picosecond or femtosecond lasers used for performing such the apertures according to the known solutions.

Although a nanosecond laser is characterized by a much larger heat affected zone than a picosecond laser, due to the structure of the PV device according to the present invention (having a carbon back electrode), the carbon electrode will combust and will not contact (bridge) with the other electrode, therefore the relatively large heat affected zone of the nanosecond laser does not cause problems in the formed structures.

Furthermore, the PV device according to the present disclosure features increased translucency, as well as it can be manufactured in the form of low weight and flexible PV module.

Also, the PV devices, according to the present disclosure depending on their final architecture and material used, may be employed in various applications, such as for example photovoltaic devices, electroluminescent devices such as LEDs (Light Emitting Diodes), building integrated photovoltaics (BIPV) for facades, windows, etc., vehicle integrated photovoltaics such as e.g. windows of cars or public transportation, electronic devices, such as Internet of Things (IoT) devices, autonomous sensors, industry 4.0 devices, smart homes/cities, portable electronics, e-readers, smartphones, smart furniture, etc.

The obtained effects are caused by the complication of features including a selection of carbon material for the back-contact electrode together with the application of laser ablation technique for forming the light-transmissive apertures which provide translucency of the PV device.

Figure 1A:
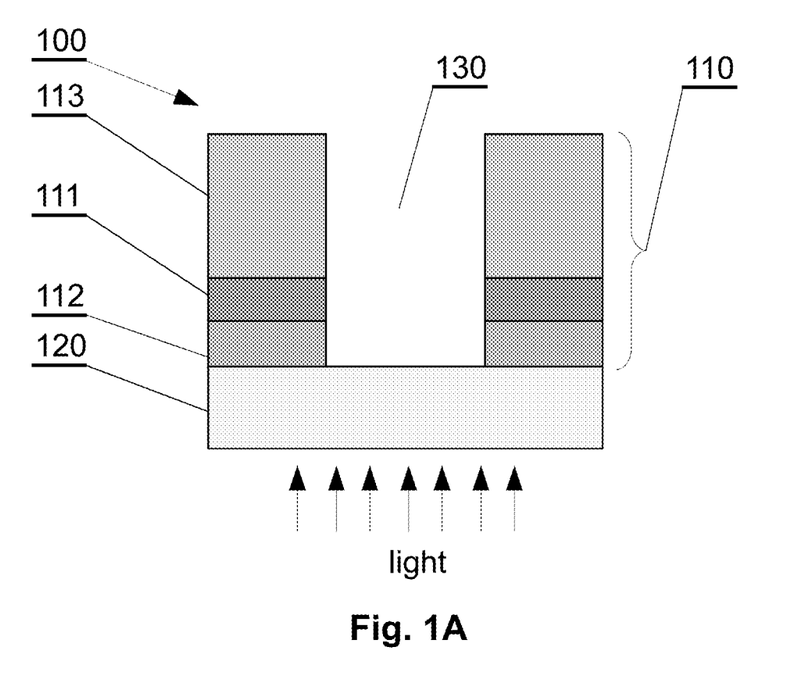
FIG. 1A is a schematic representation of the cross-sectional view showing main elements of PV cell of a translucent PV device according to the present disclosure.
Figure 1B:
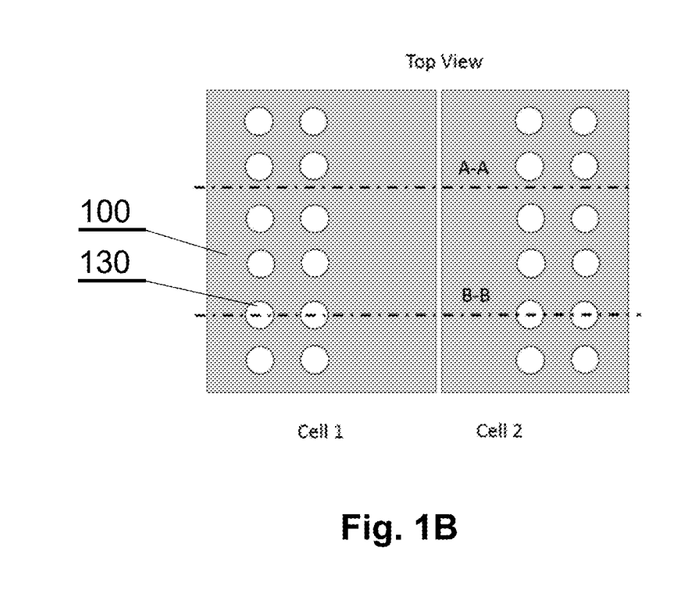
FIGS. 1B, 1C show one embodiment of a translucent PV device in a general view and two cross-sectional views according to the present disclosure.
Figure 1C:
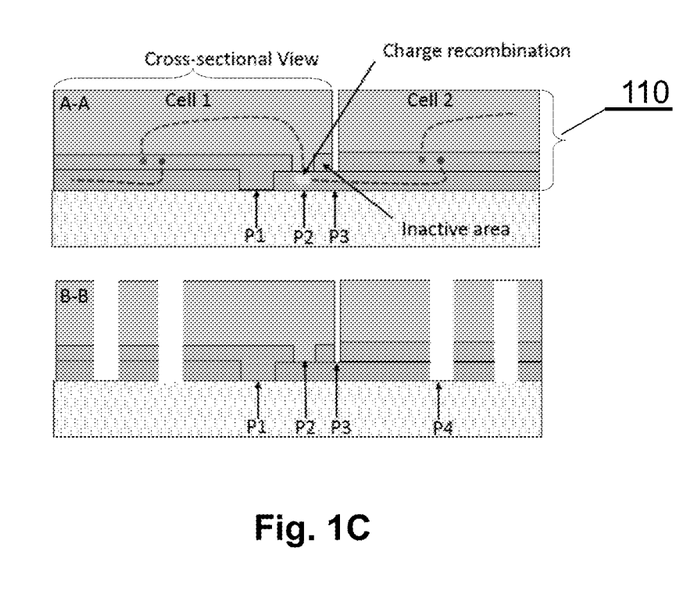

FIGS. 1A-1C show schematically the translucent PV device according to the present disclosure.

The translucent PV device comprises a translucent substrate 120, through which light can pass. Preferably, the substrate 120 is a flexible thin sheet and more preferably a plastic foil, e.g. made of PET (polyethylene terephthalate) so that the substrate 120 can be easily reversibly deformed, thus, providing flexibility of the final product. Foil, and especially PET foil may be additionally advantageous, as it exhibits limited vapor transmission, hence protecting the working layers of the PV device from water and gases exposure, thereby limiting deterioration of PV device characteristics.

Nonetheless, depending on the needs, the substrate 120 may be in a form of thick and/or durable and/or rigid material such as, for example, a glass plate. Furthermore, the substrate may be in a form of translucent laminate, such as laminated glass. According to the present disclosure, various materials may be used as the substrate 120, as long as the substrate 120 enables light to pass through it.

The PV device further comprises at least one photovoltaic cell 100. The main part of the PV cell is shown schematically in a cross-sectional view in FIG. 1A.

The PV cell comprises a stack of layers 110 comprising: a front electrode layer 112 made of semi-transparent material capable of transmitting the light to the perovskite layer 111, an opaque back electrode layer 113 made of carbon and a perovskite layer 111 between the front electrode layer 112 and the back electrode layer 113. The perovskite layer 111 is a photoactive layer of PV device. Within the perovskite material, the light photons are absorbed and converted into a pair of charges, the electron-hole pair. These charges propagate to the back electrode layer 113 and to the front electrode layer 112, respectively.

Figure 2A:
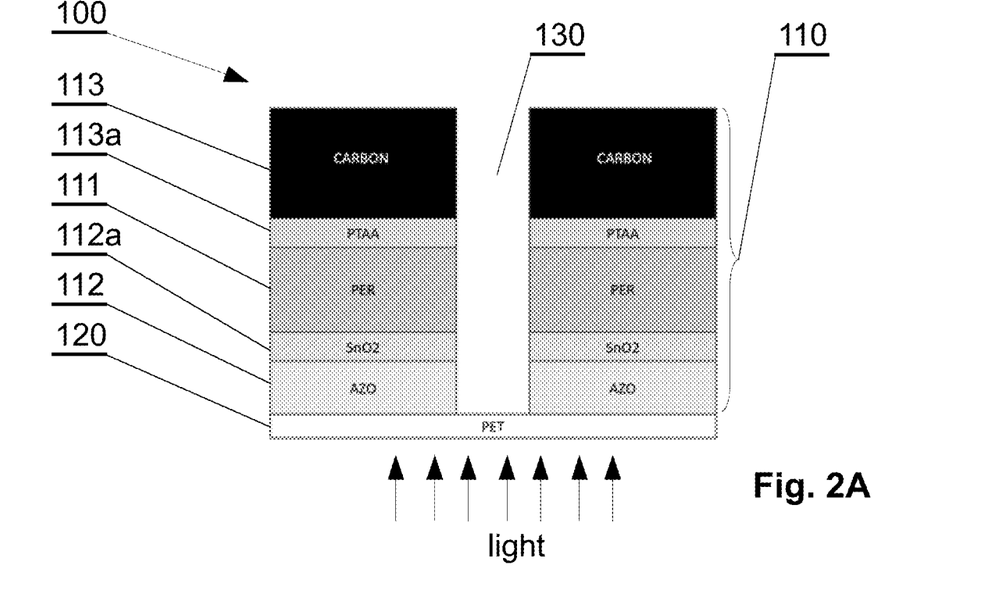
FIG. 2A is a schematic representation of the cross-sectional view showing main elements of PV cell of a translucent PV device in another embodiment according to the present disclosure.

As shown in FIG. 2A the stack 110 of layers of the PV cell preferably further comprises two charge-transporting layers 112a and 113a for transporting the holes and electrons, respectively to the front electrode layer 112 and to the back electrode layer 113, as it is normally accomplished in the known perovskite PV cells.

Depending on the desired working characteristic and functional materials used for the PV cell 100, the stack 110 of layers may have various architectures. For example, the stack 110 of the PV cell 100 may have an n-i-p architecture, either planar or mesoscopic, in which the back electrode layer 113 constitutes a cathode, and the front electrode layer 112 constitutes an anode layer, hence the charge-transporting layers 112a and 113a for carrying the charges are the electron-transporting layer 112a between the perovskite layer 111 and the anode layer 112, and hole-transporting layer 113a between the perovskite layer 111 and the cathode layer 113, respectively.

In another embodiment the stack 110 of the PV cell 100 may have a p-i-n architecture either planar or mesoscopic, in which the back electrode layer 113 constitutes an anode, and the front electrode layer 112 constitutes a cathode, hence the charge-transporting layers 112a and 113a for carrying the charges, are the hole-transporting layer 112a between the perovskite layer 111 and the cathode layer 112, and the electron-transporting layer 113a between the perovskite layer 111 and the anode layer 113, respectively.

Due to a deep work function of carbon (5-5.1 eV), it can act as a hole-transporting layer and as an electrode. Therefore, the n-i-p architecture is suitable for carbon as a top electrode for the hole extraction.

Carbon provides longer device stability than any metal electrodes as it is organic and won't react with the migrated ions from the perovskite layer. It can be a solution processable by conventional techniques like screen, slot, doctor blade coating etc. Carbon is a low cost material which is available commercially.

Moreover, it is possible to perform patterning P4 (as described in details below) in a single step via the carbon back electrode and other layers, because the laser beam burns the material of that electrode and causes its complete removal (as opposed to prior art solutions with a metal back electrode that could melt and therefore cannot be removed in a single step with other layers), therefore there is no risk of contact (bridging) between the top and bottom electrode. Alternatively, multi-step patterning P4 can be used as well, if desired.

As shown in FIG. 2A, presenting one embodiment of the PV device, the substrate 120 may be in a form of PET foil, and a PV cell 100 may comprise a stack 110 of layers of the n-i-p architecture.

The stack 110 comprises opaque back electrode layer 113 which is made of carbon and semi-transparent front electrode layer 112 which is made of AZO ($Al_2O_3$-doped ZnO). Nonetheless, other materials may be used as a front electrode layer 112 serving as a anode, wherein the group of non-limiting examples includes ITO (Indium doped Tin Oxide), FTO (Fluorine doped Tin Oxide) or DMD (Dielectric/Metal/Dielectric) structures, such as for example ITO/Ag/ITO. The stack 110 of PC cell further comprises $SnO_2$ (tin dioxide) as the charge-carrier layer 112a for propagating electrons to the cathode 112, and PTAA (a poly(triaryl amine) as the charge-transporting layer 113a for propagating holes to the anode 113 made of carbon. $SnO_2$ may be also replaced with other various materials, such as for example $TiO_x$, ZnO, PCBM or OXD-7. The same applies to PTAA material which may be replaced with e.g., $NiO_x$ (Nickel Oxide), CuSCN (Copper(I) thiocyanate), CuO (Copper(II) oxide), $MoO_x$ (Molybdenum Oxide), PEDOT (Poly(3,4-ethylenedioxythiophene)), P3HT (poly(3-hexylthiophene-2, 5-diyl)) or Spiro-OMeTAD (N2,N2,N2',N2',N7,N7,N7',N7'-octakis(4-methoxyphenyl)-9,9'-spirobi[9H-fluorene]-2,2',7, 7'-tetramine).

For the n-i-p device architecture, in which carbon back electrode layer 113 is arranged as the cathode, another non-limiting example of charge-carrier layer may be used. For example, the charge-carrier layer 113a for propagating holes to the carbon cathode layer 113 may be selected from the group consisting of: NiOx, CuSCN, CuO, MoOx, PEDOT, P3HT, Spiro-OMeTAD, and PTAA (poly(triaryl amine).

Whereas, for example, the front charge-transporting layer 112a for propagating electrons to the anode front layer 112 may bay be selected from the group consisting of: $TiO_x$ (Titanium Oxide), ZnO (Zinc Oxide), PCBM (Phenyl-C61-butyric acid methyl ester) or OXD-7 (1,3-bis[2-(4-tert-butylphenyl)-1,3,4-oxadiazo-5-yl]benzene), $SnO_x$ (Tin(II) oxide).

In another embodiment of the PV device according to the present disclosure, the carbon back electrode layer 113 may be implemented as the anode. So far, carbon has been reported in nip architecture only. The inventor of the present disclosure found that it is possible to fabricate p-i-n devices with carbon as top electrode, by providing a buffer layer between n-type layer and carbon for efficient electron transport.

Figure 2B:
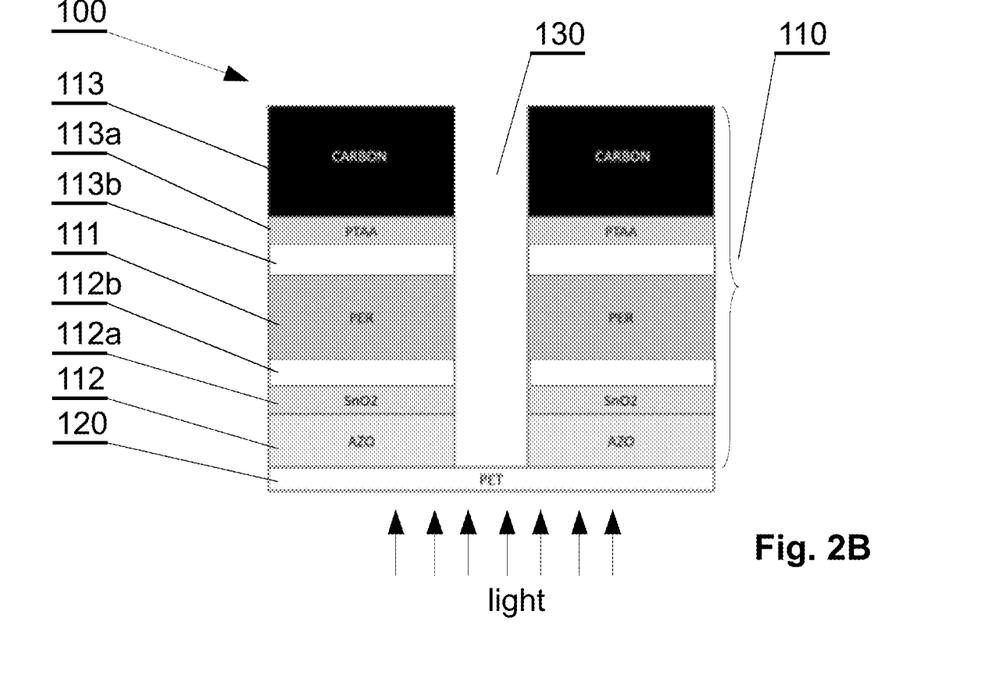
FIG. 2B is a schematic representation of the cross-sectional view showing main elements of PV cell of a translucent PV device in another embodiment according to the present disclosure.

In yet another embodiment of the present invention, as shown in FIG. 2B, additional at least one passivation layer: front passivation layer 112b, and/or back passivation layer 113b may be incorporated into the photovoltaic device 100, between the photoactive layer 111 and the charge transport layers 112a, 113a. The passivation layer 112b, 113b serves as a means to reduce or inhibit non-radiative recombination at the interface between the photoactive material 111 and the charge-transporting layer 112a, 113a. This can be achieved by ionic bonding, coordinating materials, and converting the surface to a region with a band-gap wider than that of the photoactive material 111. The passivation layer 112b, 113b may be made of a material selected from the group of: Lewis acids and bases, anions and cations, zwitterions, semiconductors and insulators. A few non-exhaustive examples include: perovskite materials with a composition different from the bulk of the photoactive layer, insulators (such as polymers such as PMMA (poly(methyl methacrylate)), small molecules, such as BCP (Bathocuproine), PCBM and its derivatives, self assembly monolayers (SAM) etc.), ionic materials, such as: NaCl, KI, and metal oxides such as $AlO_x$ (e.g. $Al_2O_3$). The thickness of the passivation layer 112b, 113b may be selected according to the needs, it improves the photovoltaic performance, however its presence does not affect significantly the process required to fabricate translucent devices via laser patterning.

The non-limiting examples of perovskite materials, which can be used in both p-i-n and n-i-p architectures, include 3-dimensional $ABX_3$ perovskite structure, which consists of a network of corner-sharing $BX_6$ octahedra, where the B atom is a divalent metal cation (typically $Ge^{2+}$, $Sn^{2+}$ or $Pb^{2+}$) and X is a monovalent anion (typically $Cl^-$, $Br^-$, $I^-$); the A cation is selected to balance the total charge and it can be a $Cs^+$ or a small molecular species. Another type is 2-Dimensional perovskite which can be classified into Ruddlesden-Popper and Dion-Jacobson type, having a structure: $R_2A_{n-1}B_nX_{3n+1}$ where R is a bulky organic cation. Phenylethylammonium ($PEA^+$) and butylammonium ($BA^+$), are the most widely used R cation.

The carbon back electrode layer 113 comprises carbon (and possibly additional inorganic additives to improve performance). The carbon layer may be flexible due to polymeric binders that bind the carbon black and conductive graphite flakes together. Moreover, the layer is thin, preferably about 20 micrometers. In order to form the carbon back electrode layer 113, the carbon material can be supplied in the form of a paste. The carbon layer 113 may be formed by applying the carbon paste as the back-contact deposition. Basic ingredients of the paste are carbon black, graphite, polymeric binders and compatible solvent system with perovskite.

For example, a carbon paste as referred to by a patent document CN104966548 can be used, having a solvent system: isopropanol, ethyl acetate and chlorobenzene. Acrylic resin and ethyl cellulose are used as binders for the slurry, flaky graphite is used as the conductive filler, nano carbon black powder is used as the catalyst, and $ZrO_2$ or NiO is used as the inorganic additives.

The carbon paste can be deposited onto the device stack by using a semi-automatic screen printer. A screen with polyester mesh size of 156-250 threads/in and a screen tension>25 N/cm can be selected for the printing process. After the deposition process the layers can be annealed by Infra-red emitter to remove the solvents and increase conductivity.

FIGS. 1B and 1C show the translucent PV device according to one embodiment of the present disclosure, wherein FIG. 1B shows the device schematically in a top view, and FIG. 1C shows schematically two cross-sectional views of the PV device, along A-A and B-B lines.

The PV device comprises at least one PV cell 100, but preferably it may comprise more than one PV cell 100. FIGS. 1B, 1C show the PV device comprising two PV cells 100. Nonetheless, the PV device may comprise more than two PV cells 100. The number of PV cells 100 implemented in one PV device depends on engineering requirements, available area, rational design (losses due to sheet resistance).

At least one PV cell 100 of the PV device is translucent, and preferably more than 50% of the PV cells 100 of the PV device is translucent, and even more preferably, all the PV cells 100 of the PV device are translucent.

Each translucent PV cell 100 of the PV device comprises at least one light-transmissive aperture 130, and preferably a plurality of light-transmissive apertures 130, formed in the stack 110 of layers of the PV cells, disposed on the substrate 120.

FIG. 1B shows a non-limiting example of an array of the light-transmissive apertures 130 provided within the PV cells 100.

The light-transmissive apertures 130 provide translucency of the PV device. Therefore, the greater the area occupied by the light-transmissive apertures 130, further referred to as a transparent area, the more translucent the PV device is.

The light-transmissive apertures 130 within the stack 110 of the PV cell working layers provide a reduction of the working area of the PV cell, therefore, the transparent area ratio preferably constitutes from 10 to 90% of the total area of the respective PV cell, depending on particular requirements for the application and module design. This provides a proper characteristic of the PV device with a visible translucency of the PV device.

Preferably, the transparent area ratio is selected upon individual needs, depending on required light transmission and performance of the PV device.

The PV cells 100 are preferably electrically connected to each other by the junction between the anode of one PV cell and the cathode of another PV cell.

Each light-transmissive aperture 130 is formed by the laser beam treatment, in a single step so that the laser beam penetrates the layers of the stack 110 and therefore removes the material of the stack, in a single operation. It was found that, due to the use of carbon back electrode layer 113, the delamination effect at the edge of the aperture 130, as present in prior art solutions, can be eliminated.

Moreover, if all layers of the stack 110 are removed, then the removal of both the front and back electrode layers provides increased translucency of the each formed light-transmissive aperture 130 and therefore the whole PV device.

The substrate 120 is not affected by the laser beam, whilst forming the light-transmissive apertures 130, due to the optimized laser parameters (as shown in Table 1 below) that removes layers without damaging the substrate. If higher laser power is used it can damage the substrate and lower power wont remove the layers fully. Therefore, after the laser treatment, the substrate 120 remains continuous, constituting a barrier protecting the interior of the PV device from the environment.

The method for manufacturing of the translucent PV device includes providing a translucent substrate 120, such as plastic foil and forming a stack 110 of working layers of the PV cell(s) 110, by successive depositing and laser patterning steps P1-P4 as described below. For example, as shown in FIG. 1C, the step of removing the front electrode by laser patterning P1, may be implemented in order to create separate cells areas. Various lasers may be used in P1 patterning, depending on the material of the front electrode, e.g., for transparent conductive oxides (TCO), typically an infrared laser is used. The second laser patterning—P2, may be required after deposition of front charge-transporting layer 112a, on the front electrode layer 112, which may be either electron-transporting or hole-transporting layer, depending on PV cell architecture, either p-i-n or n-i-p. The laser patterning P2 locally removes the charge-carrier layer 112a. Usually, in the P2 patterning IR or other visible lasers may be used.

Next, the carbon opaque back electrode layer 113 is deposited and the patterning step P3 is carried out, to define the boundaries of individual cells or to separate to individual cells.

After completion of the P3 patterning step, the carbon layer forms the back electrode layer 113 and such device comprises only opaque (non-translucent) PV cells, due to the presence of continuous carbon back electrode layer 113 which is opaque itself.

Next, the stack 110 is subjected to laser patterning P4, so that at least one, and preferably a plurality of the light-transmissive apertures 130 are formed in PV cell 100, within the stack 110 of its working layers, such that the apertures 130 extend through at least the back electrode layer 113 and at least part of the perovskite photoactive layer 111. This makes the PV cell to be light transmittive. Optionally, in order to further improve light transmission, the apertures 130 may extend through all the layers of the stack 110 from the back electrode layer 113 to the front electrode layer 112.

In P4 patterning, the laser affects the stack 110, opposite to the substrate 120.

Each light-transmissive aperture 130 is made in a single step of laser treatment so that the laser beam penetrates the layers of the stack 110 of the PV cell that are to be removed along the depth of the aperture 130, at once.

Consequently, the light-transmissive apertures 130 are fully surrounded by the layer stack 110 layers that contribute to the power conversion (in other words, by the active area of the solar cell), i.e. all layers are directly adjacent to the aperture 130 are adjacent to each other along the vertical wall of the aperture 130 (in contrast to prior art, wherein the top layer of the stack is either moved away from the aperture wall or delaminated).

By forming the apertures 130 in a single laser patterning step P4, the cross-section of the apertures 130 along their depth is substantially uniform (i.e. they form a well of a substantially straight side wall that slightly narrows towards the bottom).

Formation of the light-transmissive apertures 130, each penetrating the stack 110 of layers form the front surface to the back surface of the stack 110 in a single step, provides simplification of the method as well and shortening of the production process. In P4 patterning, the laser beam does not affect the substrate. This is accomplished by optimizing laser parameters.

In addition, after the apertures 130 are formed, at least some of the apertures 130 may be filled with functionalizing agents, such as inks or pigments that may provide colour appearance of the PV cell.

The aforementioned enhancement in the translucent PV device is provided by the developed PV cell stack 110 architecture, namely implementation of the carbon back electrode layer 113, which is naturally opaque and only upon its laser treatment becomes translucent—due to the presence of laser-made light-transmissive apertures 130.

It is believed that the carbon material of the back electrode layer 113, upon its laser treatment, undergoes complete oxidative combustion. Thus, the carbon material is removed by the laser without contamination of the interior of light-transmissive aperture 130 with by-products of the laser-carbon interaction. Unlike metal materials commonly used for the opaque back electrode layers, presumably, the carbon does not melt or evaporates, upon its interaction with a laser beam, thereby providing the effect described above. For this reason, according to the present method, the light-transmissive apertures 130 do not comprise a residual not-removed material of the back electrode layer 113, and this further provides elimination of short-circuits effects and delamination of the carbon layer (as the carbon layer does not melt).

There are also further advantages of the developed method, in which translucency is obtained by forming light-transmissive apertures 130 penetrating the working layers of the PV cell. Inter alia, the PV device, obtained by the method according to the present disclosure, can exhibit various conductivity of the material for the back electrode layer. Thicker layers decrease resistance and increase conductivity, but also increase material costs. The optimum is defined by this fine balance to match device performance with appropriate cost. Conductive silver and copper paste are also commercially available which can be screen printed to form thick layers. However, they are not preferred to do P3 as it requires high power for the removal of micron thick layer and can damage the bottom electrode. P4 lasering for transparency is also not suitable, as it can melt and short with the bottom electrode. In research works thin layer metal electrodes are formed by evaporation process in range to 100 nm which is suitable to laser P3 remove forming high geometrical fill factor devices.

Moreover, implementation of the carbon material provides no need for using additional lateral conduction layers, which are required in the known metal-grid solutions.

Due to the formation of the light-transmissive apertures 130 which permit the light to pass through the PV device, the used perovskite layers may be thicker, as the perovskite material does not constitute the light barrier in the developed architecture. The thicker the perovskite active area the more the light absorbed, which in turn generates higher photocurrent.

Furthermore, due to the implementation of the carbon layer as the back electrode layer 113, instead of the metal one, the standard less expensive laser may be used to accomplish the formation of light-transmissive apertures 130. According to the developed method, there is no need to use more expensive picosecond lasers or femtosecond lasers, thus providing the reduction of overall production costs.

For example, according to the method, the IR laser may be used in P4 patterning step, thus, the same as used in patterning steps from P1 to P3.

The arrays of the light-transmissive apertures 130 may form various patterns depending on individual needs. Also, the arrays may take forms of various aesthetical creations.

The light-transmissive apertures 130 may be of various shape obtainable by the laser beam. Nonetheless, preferably the light-active area, i.e. the non-transparent area of the stack 110 of each translucent PV cell, is electrically continuous. In other words, the light active (opaque) area thereby take a form of continuous path, running between the light-transmissive apertures 130, to collect all the charges generated in the PV cell.

Preferably the light-transmissive apertures 130 are of circular shapes, uniformly on non-uniformly distributed within the PV cell. The light-transmissive apertures 130 may be of various areas, depending on translucency needs, whereas the area of the light-transmissive apertures 130 may vary within a single PV cell. Preferably, each light-transmissive aperture 130 may have the area ranging from 1 µm2 to 1000 cm$^2$, with the spacing between two closest light-transmissive apertures 130 (depending on the resolution of the laser) in the range of 1 µm to 100 cm Multiple laser spots can be formed next to each other or overlap each other.

Substantially uniform distribution of the light-transmissive apertures 130 of the area and spacing failing into the above-given ranges, at a macroscopic scale, gives the user an impression of translucency (semi-transparency) of the whole PV device. This is caused by the selected dimensions and spacing of the light-transmissive apertures 130.

Therefore, the translucent PV device may be used for covering glass panels on buildings.

Example—Fabrication of the Translucent PV Device of n-i-p PV Cells Architecture.

The translucent PV devices were fabricated on flexible PET substrate with the front electrode layer made of AZO (300 nm) from EASTMAN, the PET and AZO were integrated forming together a foil. The remained layers of the PV cell stack were deposited by spin coating in the order: $SnO_2$ (electron-transporting layer), perovskite (as a perovskite photoactive layer) with a stoichiometric ratio $Cs_{0.05}(MA_{0.17}FA_{0.83})_{0.95}Pb(I_{0.83}Br_{0.17})_3$ wherein Cs is Cesium, MA is methylammonium, FA is formamidinium, Pb is lead, I is iodine and Br is bromine and PTAA (as a hole-transporting layer). For the back electrode layer, carbon paste from EMS (CI-2042) was blade coated and annealed by the gas quenching method with a temperature of around 80° C. for 5 min. The thickness of the carbon paste was measured to be 20 µm via FIB-SEM providing a sheet resistance around 20 Ω/sq. Subsequently, the formed devices were laser patterned (P4) using a 1064 nm Nd:YAG nanosecond laser from Rofin-Power line. Translucency was achieved by ablating a matrix of light-transmissive apertures (spots), each with diameter 200 µm and spacing 500 µm each. The laser ablation was performed so as to not disturb the PET substrate. The parameters used for the laser patterning are shown in Table 1 below.

TABLE 1

| parameters used for the laser patterning | |
| --- | --- |
| Current | 23 A |
| Frequency | 3000 Hz |
| Speed | 195 mm/s |
| Line width | 100 µm |
| Pulse width | 100 µm |
| Hatching | Bidirectional |

Figure 3:
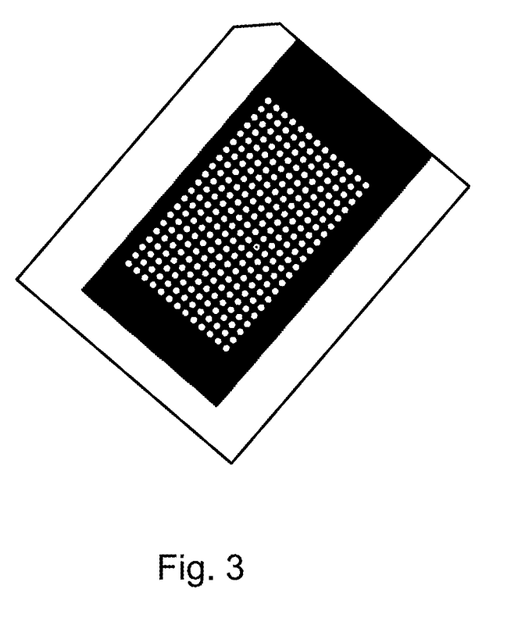
FIG. 3 presents a photo showing the perovskite photovoltaic device obtained by the method according to the present disclosure.
Figure 4A:
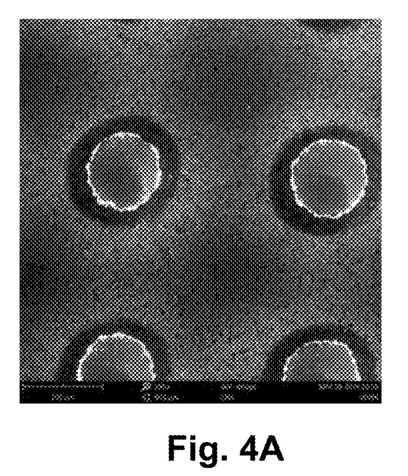
FIGS. 4A-4C are SEM photos of light-transmissive apertures formed according to the method of the present disclosure.
Figure 4B:
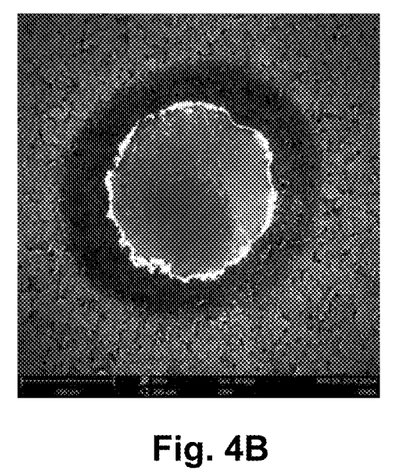
Figure 4C:
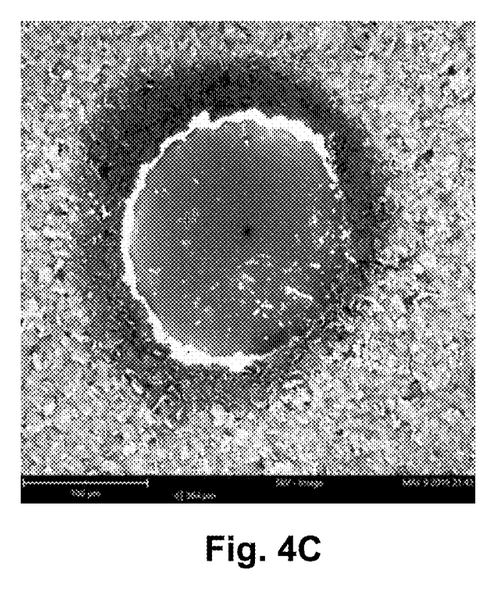

FIG. 3 is a general photo of the obtained translucent PV device, in which the formed apertures provide translucency. Next, SEM pictures were taken, to investigate the details of the formed apertures. The SEM pictures, shown in FIG. 4A-4C, were taken under a scanning electron microscope (SEM). As follows from the obtained photos, the apertures are of circular regular shape with the diameter 200 µm, each; without visible delamination effect.

Figure 6:
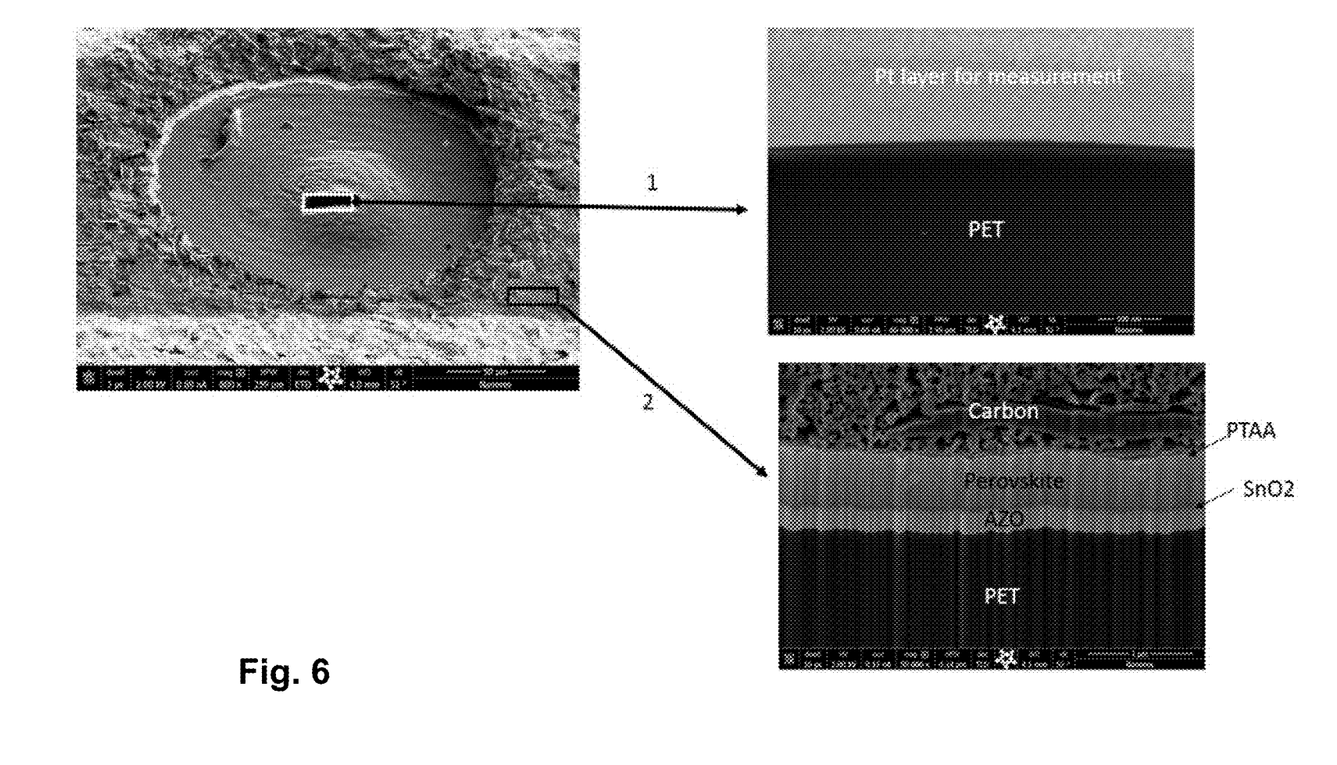
FIG. 6 shows cross-sectional FIB-SEM images of the structure.

In the course of further investigation, cross-sectional FIB-SEM (Focus Ion Beam—Scanning Electron Microscope) images of the structure inside the light transmissive aperture (130) showing (Image 1) the complete removal of layer stack (110) and showing (Image 2) the active layer stack (110).

Image 1 of FIG. 6 confirms that the laser pulse ablates all the layers, down to the substrate.

Subsequently, the obtained devices were subjected to J-V reverse scan, to evaluate their JV characteristic. The obtained results, shown in FIG. 5B confirmed that the devices are functional and generate power.

Figure 5A:
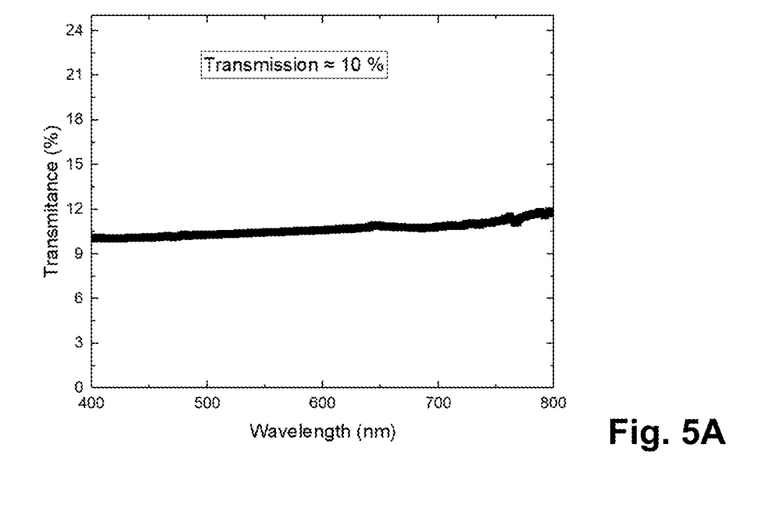
FIG. 5A shows a diagram representing transmission measurement of the translucent PV device.
Figure 5B:
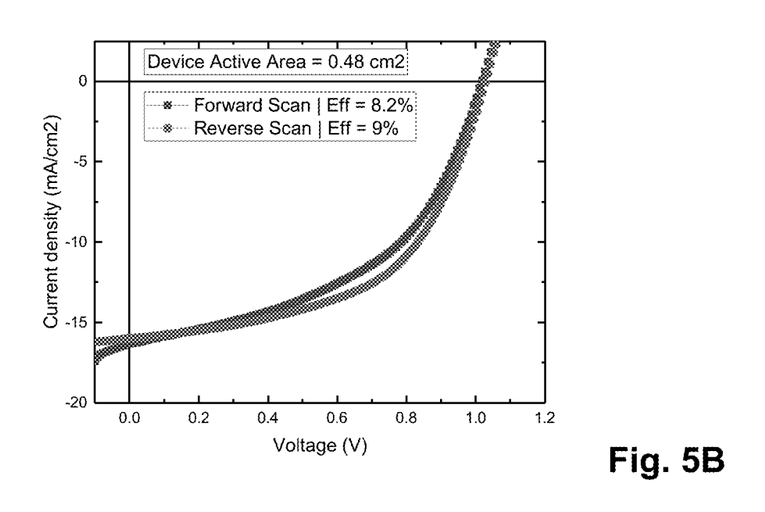
FIG. 5B. shows a diagram representing JV characteristics of forward and reverse scan of the translucent PV device.

The devices were further subjected to transmission measurement, the result of which is shown in FIG. 5A. The obtained results confirmed that the devices let light pass through.

The invention claimed is:
1. A translucent photovoltaic (PV) device comprising a semi-transparent substrate and at least one translucent photovoltaic (PV) cell, the PV cell comprising a stack of layers disposed on the substrate, the stack of layers comprising:
a front electrode layer, a carbon back electrode layer, wherein the front electrode layer and the back electrode layer constitute an anode and a cathode layer, and
a perovskite photoactive layer between the anode layer and the cathode layer,
wherein the carbon back electrode layer comprises as the basic ingredients carbon black, graphite, and polymeric binders,
wherein the stack of layers of the PV cell comprises laser-made light-transmissive apertures extending through at least the front electrode layer, the back electrode layer and the perovskite photoactive layer of the PV cell,
wherein the light-transmissive apertures are fully surrounded by the stack of layers, so that the layers of the stack of layers of the PV cell between two of the light-transmissive apertures are not interrupted, and
wherein each of the apertures includes walls, and wherein the walls of the apertures form substantially smooth surfaces and extend through at least the back electrode layer, the front electrode layer, and the photoactive layer; and
the front electrode layer and the back electrode layer are substantially perovskite free.

2. The translucent PV device according to claim 1, wherein the semi-transparent substrate is flexible.

3. The translucent PV device according to claim 1, wherein the back electrode layer has a thickness from 10 nanometers to 1000 micrometers.

4. The translucent PV device according to claim 1, comprising a plurality of translucent PV cells, each comprising plurality of the laser-made light-transmissive apertures having an area from 1 µm$^2$ to 1000 cm$^2$, and spacing between two adjacent light-transmissive apertures of 1 µm to 100 cm.

5. The translucent PV device according to claim 1 wherein the wherein perovskite is located substantially only in the perovskite layer.

6. The translucent PV device according to claim 1 wherein a cross-section of the light-transmissive apertures along their depth is substantially uniform.

7. The translucent PV device according to claim 1 wherein perovskite is located only in the perovskite layer and the semi-transparent substrate is polyethylene terephthalate.

8. The translucent PV device according to claim 1, wherein the stack of layers further comprises a front charge-transporting layer disposed between the perovskite layer and the front electrode layer, and a back charge-transporting layer disposed between the perovskite layer and the carbon back electrode layer.

9. The translucent PV device according to claim 8, further comprising a front passivation layer disposed between the perovskite layer and the front charge-transporting layer and/or a back passivation layer disposed between the perovskite layer and the back charge-transporting layer.

10. The translucent PV device according to claim 1, with the PV cell of n-i-p architecture.

11. The translucent PV device according to claim 10, with the stack of layers of PV cell of the following configuration: AZO/SnO$_2$/perovskite/PTAA/carbon.

12. A method for manufacturing a translucent photovoltaic (PV) device comprising at least one translucent photovoltaic (PV) cell, the method comprising the steps of:
providing a semi-transparent substrate;
forming a stack of layers of the PV cell on the substrate, the stack of layers comprising: a front electrode layer, a back electrode layer, wherein the front electrode layer and the back electrode layer constitute an anode and a cathode layer, and a perovskite photoactive layer between the front electrode layer and the back electrode layer;
wherein
the step of forming the stack of layers of the PV cell comprises forming the back electrode layer from a carbon paste of which the basic ingredients are carbon black, graphite, polymeric binders, and a solvent system compatible with perovskite;
the method further comprises a step of laser patterning of light-transmissive apertures in the stack of layers of the PV cell;
the light-transmissive apertures extend through at least the back electrode layer and at least part of the perovskite photoactive layer and are fully surrounded by the stack of layers, so that the layers of the stack of layers of the PV cell between two of the light-transmissive apertures are not interrupted;
a cross-section of the light-transmissive apertures along their depth is substantially uniform;
wherein each of the apertures includes walls, and wherein the walls of the apertures form substantially smooth surfaces and extend through at least the back electrode layer, the front electrode layer, and the photoactive layer; and
the front electrode layer and the back electrode layer are substantially perovskite free.

13. The method according to claim 12, wherein each light-transmissive aperture is formed in a single step laser patterning.

14. The method according to claim 12, wherein the light-transmissive apertures are formed by using a nanosecond IR laser.

15. The method according to claim 12, wherein the light-transmissive apertures are formed in plurality in the stack of layers of each PV cell.

16. The method according to claim 12, wherein the light-transmissive apertures have an area of 1 µm$^2$ to 1000 cm$^2$, and spacing between two adjacent light-transmissive apertures of 1µm to 100 cm.

17. The method according to claim 12, wherein the step of forming the stack of layers further comprises formation of a front charge-transporting layer between the perovskite layer and the front electrode layer, and formation of a back charge-transporting layer between the perovskite layer and the carbon back electrode layer.

18. The method according to claim 17, wherein the step of forming the stack of layers further comprises formation of a front passivation layer between the perovskite layer and the front charge-transporting layer and/or a back passivation layer between the perovskite layer and the back charge-transporting layer.

19. The method according to claim 12, wherein the forming of the back electrode layer comprises the steps of:
providing a carbon paste;
forming a carbon layer as a top layer of the stack of layers of PV cell; and
drying the carbon layer in the stack of layers to obtain the carbon back electrode layer.

* * * * *